United States Patent
Jeong

(10) Patent No.: US 10,706,946 B2
(45) Date of Patent: *Jul. 7, 2020

(54) ONE-TIME PROGRAMMABLE MEMORY DEVICE

(71) Applicant: MagnaChip Semiconductor, Ltd., Cheongju-si (KR)

(72) Inventor: Duk Ju Jeong, Seoul (KR)

(73) Assignee: MAGNACHIP SEMICONDUCTOR, LTD., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/619,300

(22) Filed: Jun. 9, 2017

(65) Prior Publication Data
US 2018/0025785 A1   Jan. 25, 2018

(30) Foreign Application Priority Data
Jul. 25, 2016 (KR) .......................... 10-2016-0094318

(51) Int. Cl.
| | | |
|---|---|---|
| G11C 17/00 | (2006.01) | |
| G11C 17/18 | (2006.01) | |
| G11C 17/16 | (2006.01) | |

(52) U.S. Cl.
CPC .............. G11C 17/18 (2013.01); G11C 17/16 (2013.01)

(58) Field of Classification Search
CPC .................................... G11C 8/10; G11C 8/12
USPC .............................................. 365/230.06, 96
See application file for complete search history.

(56) References Cited

U.S. PATENT DOCUMENTS

| | | | | |
|---|---|---|---|---|
| 5,949,703 | A * | 9/1999 | Shibata ................. | G11C 29/789 365/103 |
| 6,512,693 | B2 * | 1/2003 | Honda ..................... | G11C 8/12 365/185.11 |
| 6,882,567 | B1 * | 4/2005 | Wong ................... | G11C 11/5628 365/185.03 |
| 2005/0013162 | A1 * | 1/2005 | Jeon ......................... | G11C 7/20 365/185.01 |
| 2009/0116288 | A1 * | 5/2009 | Varkony ................ | G11C 5/145 365/185.13 |
| 2009/0122604 | A1 * | 5/2009 | Liu ..................... | G11C 16/0416 365/185.03 |
| 2016/0141049 | A1 * | 5/2016 | Song ...................... | G11C 17/16 365/51 |

(Continued)

FOREIGN PATENT DOCUMENTS

KR   10-2009-0110524 A   10/2009

Primary Examiner — Huan Hoang
Assistant Examiner — Minh Dinh
(74) Attorney, Agent, or Firm — Adam P. Daniels, Esq.; Polsinelli

(57) ABSTRACT

Provided is a one-time programmable (OTP) memory device, which includes a data input circuit that receives a supply voltage and applies the supply voltage to one of a plurality of bit lines that is selected by a write switch, and an OTP memory cell array including a plurality of OTP memory cells arranged in a plurality of rows and columns. The OTP memory cells on the same row connected to the same bit line. The OTP memory device also includes a column decoder that selects one of the plurality of columns of the OTP memory cells to apply the supply voltage thereto, and a detection amplifier that performs a read operation of the OTP memory cells connected to one of the plurality of bit lines that is selected by a read switch.

20 Claims, 10 Drawing Sheets

(56) References Cited

U.S. PATENT DOCUMENTS

2017/0287570 A1* 10/2017 Bang ................. G11C 17/16
2017/0301405 A1* 10/2017 Zhang ................ G11C 17/165

* cited by examiner

ONE-TIME PROGRAMMABLE MEMORY DEVICE

CROSS REFERENCE TO PRIOR APPLICATIONS

This application claims priority to and the benefit thereof from Korean Patent Application No. 10-2016-0094318 filed on Jul. 25, 2016, titled OTP MEMORY DEVICE, the entirety of which is hereby incorporated herein by reference.

FIELD OF THE DISCLOSURE

The present disclosure relates to a one-time programmable (OTP) memory device, and, more particularly, to an OTP memory architecture that allows to efficiently drive a plurality of OTP memory cells arrayed in a matrix of a plurality of rows and columns.

BACKGROUND OF THE DISCLOSURE

A memory device is an electronic device that stores information (data). There are various types of the memory devices, including semiconductor memory devices which may be largely classified into volatile memory and non-volatile memory devices. The volatile memory device retains data stored therein while powered on, but when the power is interrupted, the stored data is lost. In contrast, the non-volatile memory device maintains stored data even when power is turned off.

The non-volatile memory includes an OTP memory device. In an OTP memory device, a memory cell is driven by a write word line, a bit line, and a source line. A programming operation of the OTP memory cell may be performed by controlling the write word line, the bit line, and the source line differently. For example, a programmed cell may be applied with a voltage of about 5.5V to its source line, whilst an unprogrammed cell is applied with a voltage of about 1.5V to the source line. As such, it is necessary to arrange an additional source line to drive an OTP memory cell and a voltage of the source line should be controlled differently according to whether the cell is being programmed or not. However, if a cell array is programmed using various voltages, the cell may not be accurately programmed because of voltage mismatches. Also, there is difficulty in manufacturing an OTP cell array that requires multiple power lines routed therein.

Accordingly, there exists a need for an OTP memory device architecture that allows for efficient programming and driving of a plurality of OTP memory cells.

SUMMARY OF THE DISCLOSURE

According to an aspect of the disclosure, a one-time programmable (OTP) memory device includes a data input circuit that receives a supply voltage and applies the supply voltage to one of a plurality of bit lines that is selected by a write switch; an OTP memory cell array including a plurality of OTP memory cells arranged in a plurality of rows and columns, the OTP memory cells on the same row connected to the same bit line; a column decoder that selects one of the plurality of columns of the OTP memory cells to apply the supply voltage thereto; and a detection amplifier that performs a read operation of the OTP memory cells connected to one of the plurality of bit lines that is selected by a read switch.

The OTP memory cells that are selected simultaneously by the write switch and the column decoder may perform a programming operation.

The OTP memory cells that are selected simultaneously by the write switch and the column decoder may receive the supply voltage from each of the data input circuit and the column decoder.

The plurality of OTP memory cells may be formed without a source line, and the OTP memory cells that are selected simultaneously by the write switch and the column decoder may perform a programming operation using the supply voltage applied to the bit line.

Each of the plurality of OTP memory cells may include a switching element that is connected to the bit line and is turned on or off in response to a selection by the column decoder; and an OTP cell that performs, when the switching element is turned on, a programming or read operation using a voltage applied to the bit line. The switching element may include an NMOS transistor.

Each of the OTP memory cells that is selected simultaneously by the write switch and the column decoder may turn on the switching element to apply the supply voltage, which may be received via a drain of the switching element, directly to the OTP cell.

Each of the OTP memory cells that is selected simultaneously by the read switch and the column decoder may turn on the switching element to perform a read operation.

The plurality of OTP memory cells may be formed on a single P-well.

The OTP memory device may further include a power selection circuit that receives the supply voltage from an external supply voltage pad and provides the supply voltage to the data input circuit and the column decoder.

The power selection circuit may select the supply voltage or a rated voltage using first and second switching devices and may provide the selected voltage to the data input circuit and the column decoder. The first and second switching devices may be opened and closed based on a write enable signal and a write enable bar signal.

The power selection circuit may shift the write enable signal and the write enable bar signal and turn on one of the first and second switching devices to select the supply voltage or the rated voltage.

The OTP memory cells that are selected simultaneously by the write switch and the column decoder may perform a programming operation using the supply voltage provided from the power selection circuit.

The OTP memory device may further include an address decoder that shifts a level of a power voltage prior to converting the power voltage to the supply voltage, and may pre-decode the level-shifted supply voltage.

The column decoder may generate a read-and-write enable signal based on the pre-decoded supply voltage, and may provide the read-and-write enable signal to the plurality of OTP memory cells.

The OTP memory device may further include a switch control circuit that generates a write switch enable signal that turns on the write switch, and a read switch enable signal that turns on the read switch.

The OTP memory device may further include a plurality of input/output (IO) modules. Each IO module may include the OTP memory cell array, the data input circuit, and the detection amplifier.

The plurality of OTP memory cells included in each IO module may be controlled by the same column decoder.

According to another aspect of the disclosure, a one-time programmable (OTP) memory device includes a data input circuit that receives a supply voltage and applies the supply voltage to one of a plurality of bit lines that is selected by a write switch; an OTP memory cell array including a plurality of OTP memory cells arranged in a plurality of rows and columns, the OTP memory cells arranged on the same row connected to the same bit line; a column decoder that selects one of the plurality of columns of the OTP memory cells to apply the supply voltage thereto; a power selection circuit that receives the supply voltage from a supply voltage pad and provides the supply voltage to the data input circuit and the column decoder; and an address decoder that shifts a level of a power voltage to generate the supply voltage, and pre-decodes the level-shifted supply voltage.

According to yet another aspect of the disclosure, a one-time programmable (OTP) memory device includes a plurality of OTP memory cells arranged in a plurality of rows and columns; a plurality of bit lines, each bit line connected to the OTP memory cells on the same row; a data input circuit that applies a supply voltage to one of the plurality of bit lines; and a column decoder that applies the supply voltage to one of the plurality of columns of the OTP memory cells. A programming operation is performed on the OTP memory cell that is on the column applied with the supply voltage and connected to the bit line applied with the supply voltage.

The OTP memory device further includes a write switch that selects one of the plurality of bit lines for the programming operation.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced.

DETAILED DESCRIPTION OF THE DISCLOSURE

Figure 1:
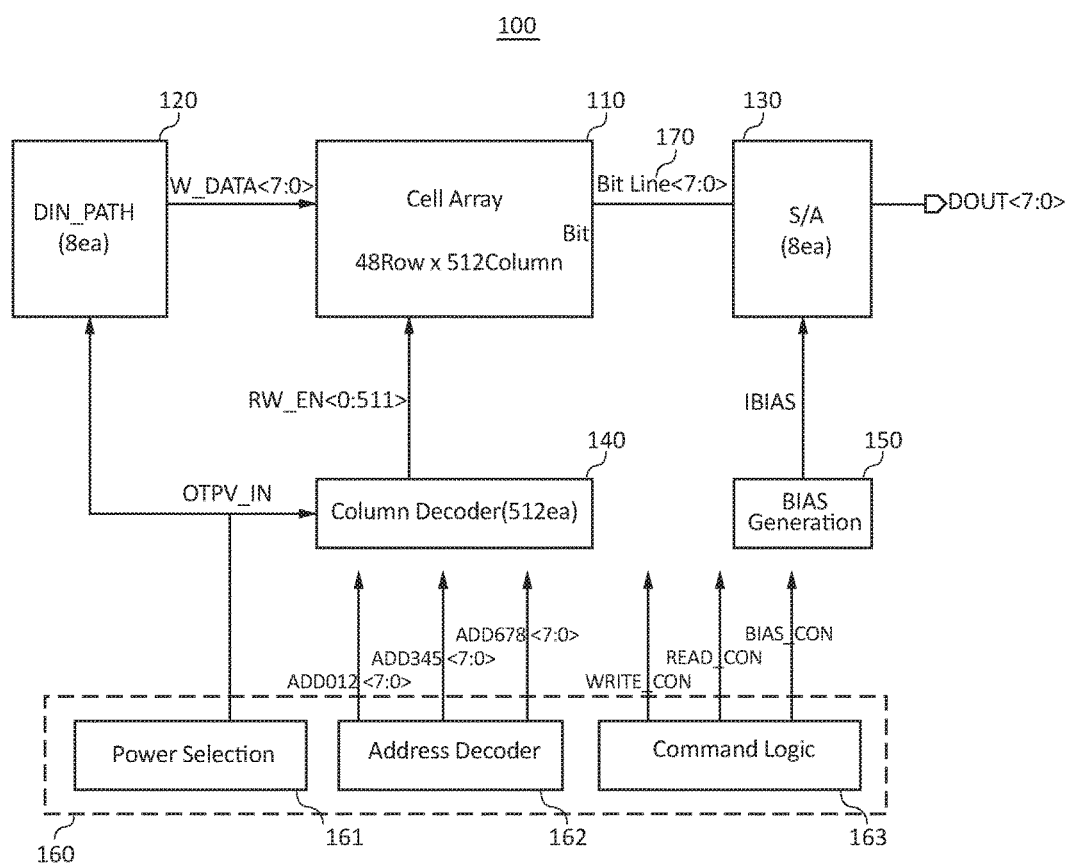
FIG. 1 is a block diagram of an example of an OTP memory device, constructed according to the principles of the disclosure.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Figure 2:
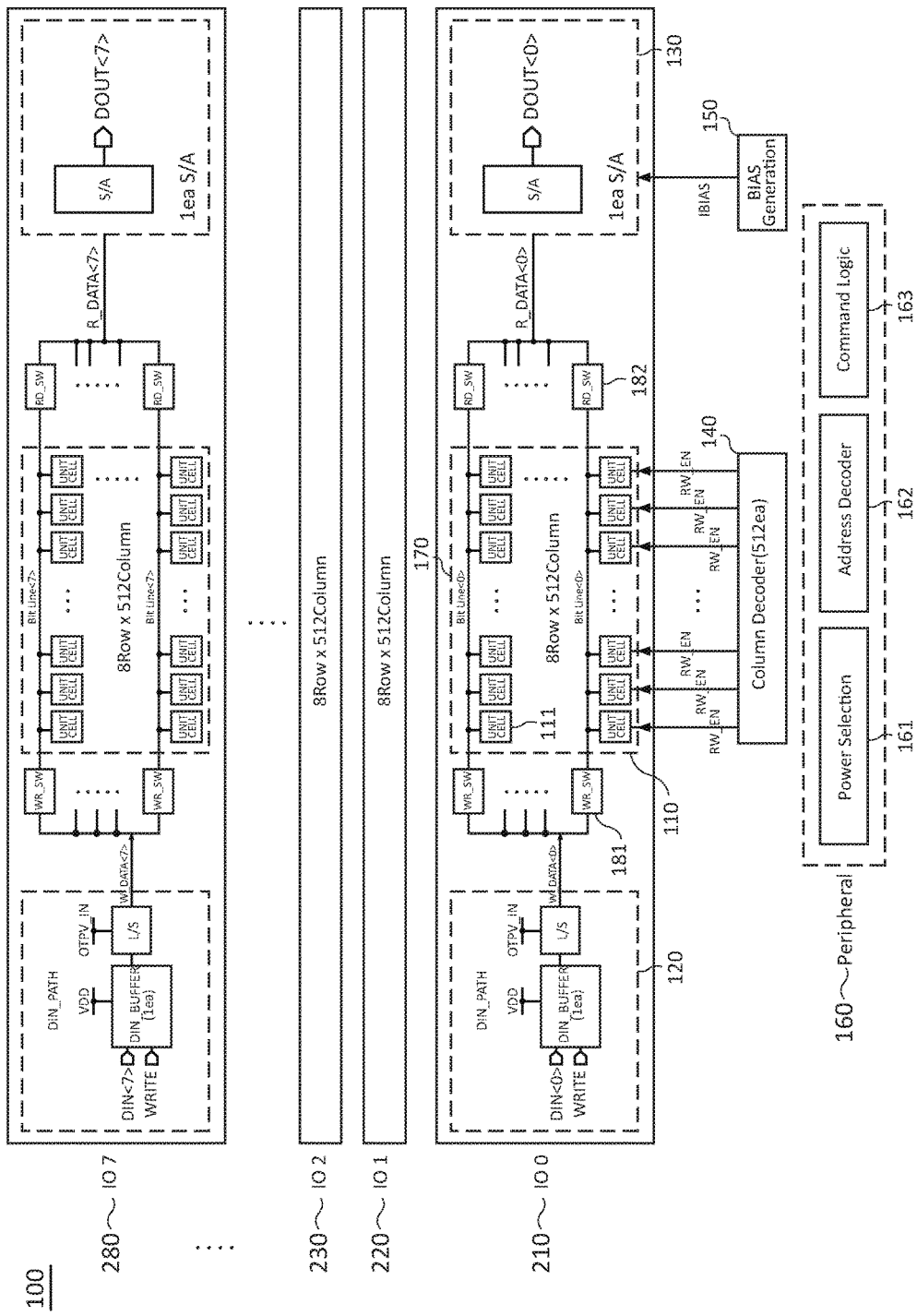
FIG. 2 is a block diagram of an example of input/output (IO) modules included in the OTP memory shown in FIG. 1, constructed according to the principles of the disclosure.

FIG. 1 is a block diagram of an example of an OTP memory device 100 constructed according to the principles of the disclosure. FIG. 2 is a block diagram of an example of a plurality of input/output (IO) modules 210-280, constructed according to the principles of the disclosure, which may be included in the OTP memory 100 shown in FIG. 1.

Referring to FIGS. 1 and 2 concurrently, the OTP memory device 100 may include, for example, an OTP memory cell array 110, a data input circuit 120, a detection amplifier 130, a column decoder 140, a bias generation circuit 150, a periphery circuit 160, a bit line 170, a plurality of write switches 181, and a plurality of read switches 182. The periphery circuit 160 may include a power selection circuit 161, an address decoder 162, and a command logic circuit 163.

The OTP memory cell array 110 may be driven by a supply voltage OTPV_IN, and a plurality of OTP memory cells UNIT CELL 111 (shown in FIG. 2) sharing a plurality of bit lines 170 may be arranged in a matrix of a plurality of rows and columns. For example, as seen in FIG. 2, the OTP memory cells 111 may be arranged in a matrix of 8 rows and 512 columns, and the OTP memory cells 111 on the same row may be connected to the same bit lines 170. The memory cells 111 may be arranged in more or less rows and columns, for example, 12 rows and 512 columns, 16 rows and 512 columns, etc., to have a greater or smaller number of memory bits of the OTP memory device 110. The OTP cells 111 on the same row may be connected to the same terminal of the data input circuit 120 via the same bit line 170. The OTP memory cells 111 on the same column may be connected to the same terminal of the column decoder 140. A row of the OTP memory cells 111 may be selected by turning on one of the write switches 181 corresponding to the row, and a column of the OTP memory cells 111 may be selected by the column decoder 140.

The OTP memory cells 111 may be configured to perform a programming operation when selected simultaneously by the write switch 181 and the column decoder 140. More specifically, when simultaneously selected by the write switch 181 and the column decoder 140, the OTP memory cells 111 may receive the supply voltage OTPV_IN from the data input circuit 120 and the column decoder 140. When selected by only one of the write switch 181 and the column decoder 140, the OTP memory cells 111 may not perform a programming operation.

Figure 9:
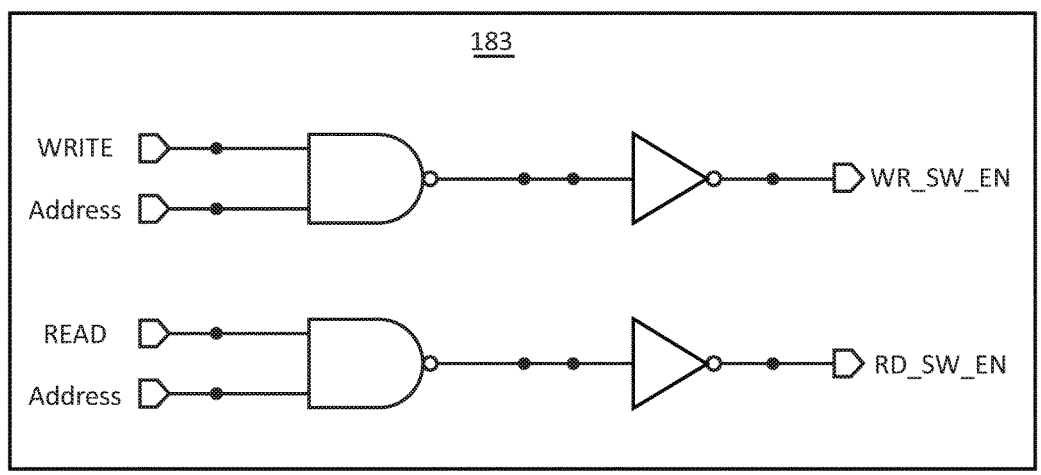
FIG. 9 schematically illustrates an example of a switch control circuit of the OTP memory device shown in FIG. 1, constructed according to the principles of the disclosure.

The data input circuit 120 may receive the supply voltage OTPV_IN, and supply the supply voltage OTPV_IN to one of the bit lines 170 when the corresponding write switch 181 is selected and activated by, for example, a write switch enable signal WR_SW_EN (shown in FIG. 9). The supply voltage OTPV_IN may be a voltage supplied externally. The data input circuit 120 may be connected to the OTP memory cells 111 via one of the bit lines 170 to apply the supply voltage OTPV_IN to the OTP memory cells 111 on the same row. More specifically, the data input circuit 120 may provide a write-data signal W_DATA to one of the bit lines 170 that is selected by the corresponding write switch 181.

When the IO module 210 is constructed with a single OTP memory cell array 110 having the OTP memory cells 111 arranged in 8 rows and 512 columns, the IO module 210 may include a single data input circuit 120 and eight write switches 181. The single data input circuit 120 may apply the supply voltage OTPV_IN to one of the bit lines 170 via a turned-on one of the eight write switches 181. Therefore, the OTP memory device 100 may drive the OTP memory cells 111 using the single data input circuit 120, thereby reducing the device size.

The detection amplifier 130 may be connected to the bit lines 170 to perform a read operation of the OTP memory cells 111. The detection amplifier 130 may perform a read operation of the OTP memory cells 111 connected to one of the bit lines 170 that is selected by the read switch 182. The detection amplifier 130 may be connected to the OTP memory cells 111 via the bit lines 170, and the voltages of the bit lines 170 may be discharged by the OTP memory cells 111. The detection amplifier 130 may receive a read-data signal (R_DATA) from one of the bit lines 170 that is selected by the read switch 182.

When the IO module 210 is constructed with a single OTP memory cell array 110 having the OTP memory cells 111 arranged in 8 rows and 512 columns, the IO module 210 may include a single detection amplifier 130 and eight read switches 182. The single detection amplifier 130 may receive the read-data signal R_DATA from one of the bit lines 170 when the corresponding read switch 182 is selected and activated by, for example, a read switch enable signal RD_SW_EN (shown in FIG. 9). Therefore, the OTP memory device 100 may drive the OTP memory cells 111, that is, the OTP memory cell array 110, using the single detection amplifier 130, thereby reducing the device size.

The column decoder 140 may select one of the columns of the OTP memory cells 111 to supply the supply voltage OTPV_IN thereto. The column decoder 140 may generate and provide a read-and-write enable signal RW_EN to the OTP memory cells 111. The column decoder 140 may select a column of the OTP memory cells 111 to perform a programming or read operation thereon. The column decoder 140 may provide the read-and-write enable signal RW_EN to the OTP memory cells 111 to the selected column of the OTP memory cell 111 to perform a programming or read operation thereon.

The column decoder 140 may include an NAND gate, which may include three input stages. The column decoder 140 may receive a pre-decoded supply voltage ADD012<7:0>, ADD345<7:0>, ADD67<3:0> via the three input stages to generate the read-and-write enable signal RW_EN.

The bias generation circuit 150 may generate and provide a bias current IBIAS to the detection amplifier 130. The OTP memory device 100 may be constructed such that the single bias generation circuit 150 provides the bias current IBIAS to all of the detection amplifiers 130 in the IO modules 210 to 280.

Each of the IO modules 210 to 280 may include the OTP memory cell array 110, the data input circuit 120, and the detection amplifier 130. The rows of the OTP memory cells 111 may be arranged along the bit lines 170, respectively. The OTP memory cell array 110 may be controlled by the single data input circuit 120 and the single detection amplifier 130. Therefore, the OTP memory device 100 may drive the OTP memory cells 111 using the single data input circuit 120 and the single detection amplifier 130, thereby reducing the device size.

All of the OTP memory cell array 110 of the IO modules 210 to 280 may be controlled by the column decoder 140 and the single bias generation circuit 150. Therefore, the OTP memory device 100 may control each OTP memory cell array 110 of the IO modules 210 to 280 using the column decoder 140 and the single bias generation circuit 150, thereby reducing the device size.

The OTP memory device 100 may be constructed such that all of the IO modules 210 to 280 are controlled using the single periphery circuit 160. The power selection circuit 161 may receive an external voltage OTPV (shown in FIG. 5) via an external supply voltage pad (not shown), and may generate and provide the supply voltage OTPV_IN to the data input circuit 120 and the column decoder 140. The supply voltage OTPV_IN may correspond to the external voltage. The address decoder 162 may shift a level of a power voltage VDD to be converted into the supply voltage OTPV_IN, and pre-decode the level-shifted supply voltage OTPV_IN. The command logic circuit 163 may provide a control signal to perform a programming (write) or read operation of the OTP memory cells 111.

Figure 3:
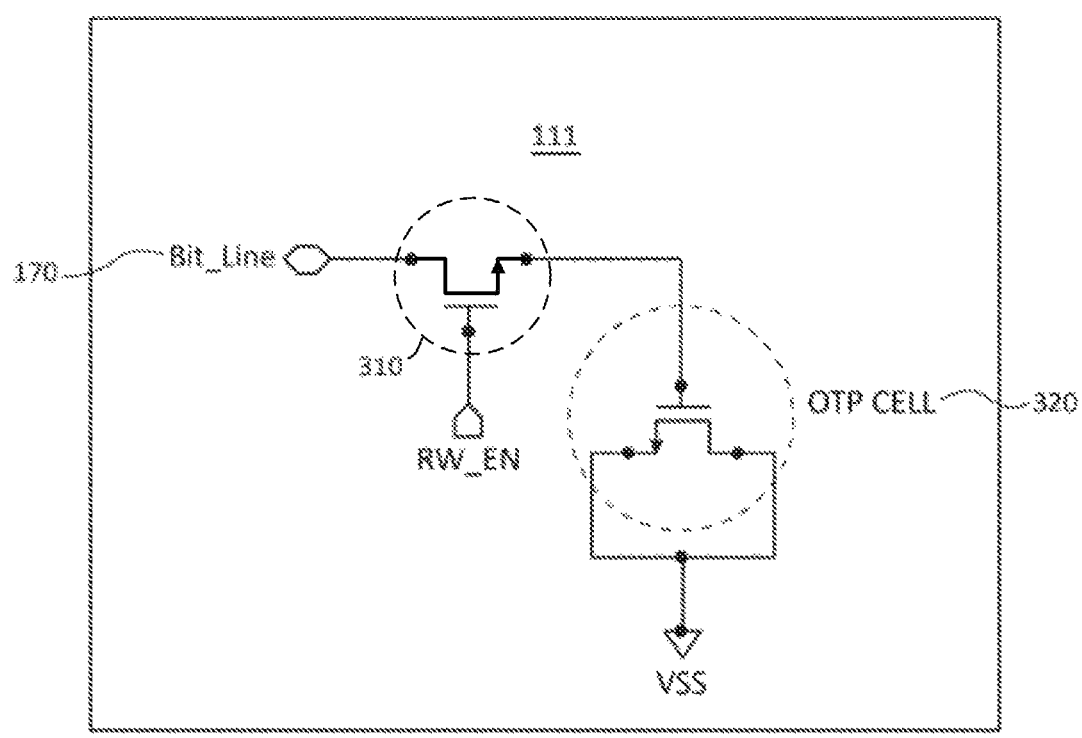
FIG. 3 schematically illustrates an example of an OTP memory cell of the OTP memory device shown in FIG. 1, constructed according to the principles of the disclosure.
Figure 4:
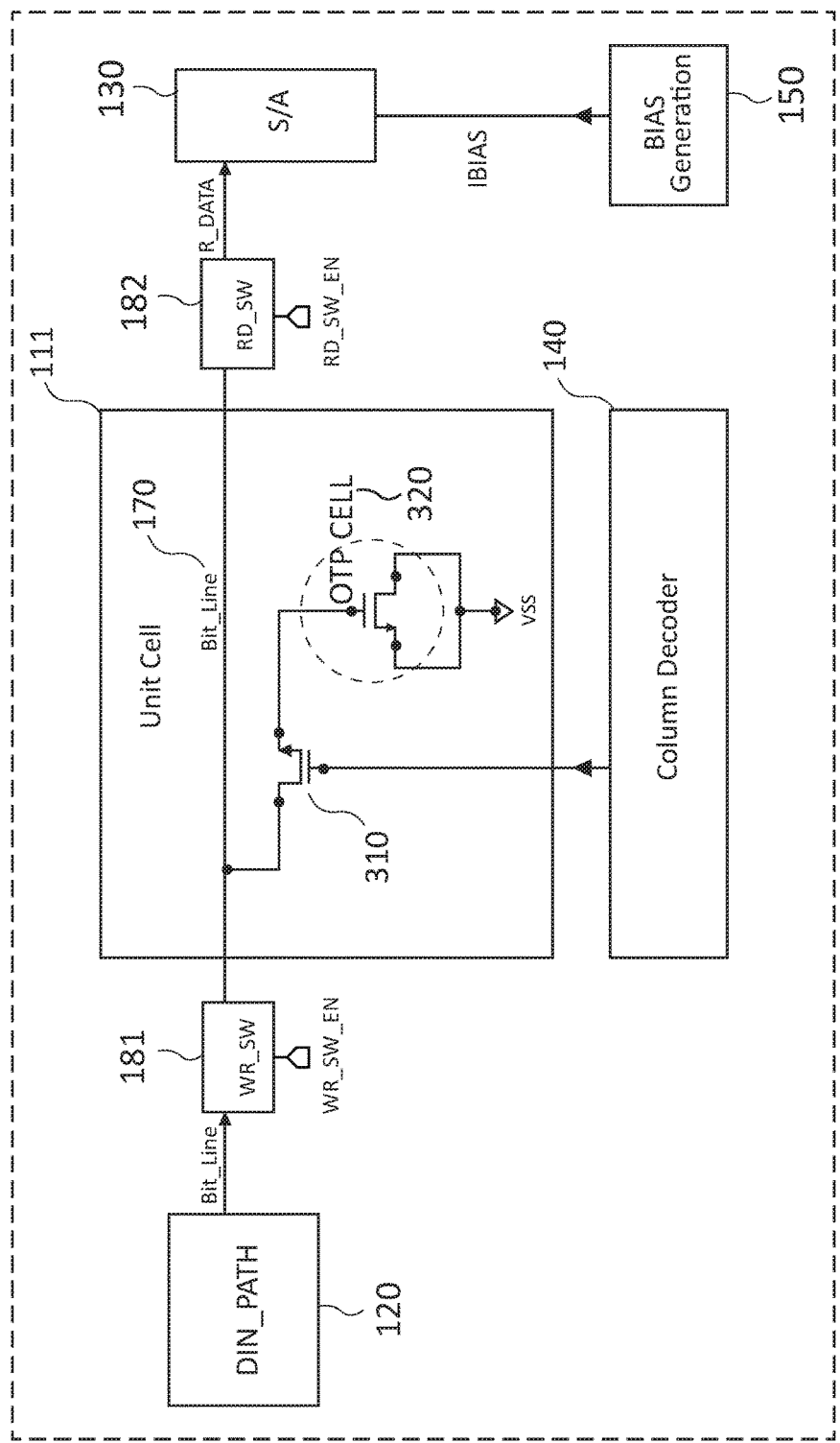
FIG. 4 schematically illustrates an example of the OTP memory device shown in FIG. 1, constructed according to the principles of the disclosure.

FIG. 3 schematically illustrates an example of the OTP memory cell 111 of the OTP memory device shown in FIG. 1, and FIG. 4 schematically illustrates a partial example of the OTP memory device shown in FIG. 1.

Referring to FIGS. 3 and 4, each of the OTP memory cells 111 may include a switching element 310 and an OTP cell 320. The switching element 310 may be connected to the bit line 170, and may be turned on and off by the column decoder 140. For example, the switching element 310 may receive a supply voltage OTPV_IN via the bit line 170, and may be turned on by the read-and-write enable signal RW_EN supplied from the column decoder 140. The switching element 310 may include an n-type metal-oxide-semiconductor field-effect transistor (nMOSFET or NMOS). It is noted that the switching element 310 may include other types of switching components, such as, for example, transistors, diodes, or the like, as those skilled in the art will understand after reading the instant disclosure.

The switching element 310 may receive the write-data signal W_DATA from the data input circuit 120, and receive the read-and-write enable signal RW_EN from the column decoder 140. The switching element 310 may receive the write-data signal W_DATA via a drain thereof from the data input circuit 120 to thereby be supplied with the supply voltage OTPV_IN from the power selection circuit 161. The switching element 310 may receive the read-and-write enable signal RW_EN via a gate thereof to thereby be turned on. When the switching element 310 is turned on, the switching element 310 may provide the supply voltage OTPV_IN applied to the drain to the OTP cell 320.

The switching element 310 may be turned on and off by the read-and-write enable signal RW_EN. For example, when the read-and-write enable signal RW_EN corresponds to a high level (or 1), the switching element 310 may be turned on, and when the read-and-write enable signal RW_EN corresponds to a low level (or 0), the switching element 310 may be turned off.

When the switching element 310 is turned on, the OTP cell 320 may perform a programming operation using the supply voltage OTPV_IN. The OTP cell 320 may be constructed with a switching element, and may receive the supply voltage OTPV_IN via a gate thereof. When the OTP cell 320 receives the supply voltage OTPV_IN, blowing of a gate oxide may occur, which may result in a short-circuit between the gate oxide and a P-well. More specifically, when the OTP cell 320 receives the supply voltage OTPV_IN, the gate and the P-well of the OTP cell 320 may be connected to perform a programming operation using the supply voltage OTPV_IN. Therefore, the OTP memory cells 111 may not include a source line, and, when selected simultaneously by the write switch 181 and the column decoder 140, each of the OTP memory cells 111 may perform a programming operation using the supply voltage OTPV_IN applied to the bit line 170.

When simultaneously selected by the write switch 181 and the column decoder 140, each of the OTP memory cells 111 may perform a programming operation using the supply voltage OTPV_IN supplied from the power selection circuit 161. Since each of the OTP memory cells 111 does not include an additional source line and does not need an additional voltage other than the supply voltage OTPV_IN, the OTP memory device 100 may be manufactured with a reduced size at a reduced manufacturing cost compared to existing memory device (not shown).

When simultaneously selected by the write switch 181 and the column decoder 140, each of the OTP memory cells 111 may turn on the switching element 310 to apply the supply voltage OTPV_IN, received via the drain of the switching element 310, directly to the OTP cell 320.

When simultaneously selected by the read switch 182 and the column decoder 140, each of the OTP memory cells 111 may turn on the switching element 310 to perform a read operation. When the read operation of the OTP cell 320 is performed, the data input circuit 120 may not provide the write-data signal W_DATA to the OTP memory cell 111, and the detection amplifier 130 may receive the read-data signal R_DATA from the OTP memory cell 111. Thus, when the read operation of the OTP cell 320 is performed, the write switch 181 may be turned off to thereby block the write-data signal W_DATA, whereas the read switch 182 may be turned on to thereby allow the detection amplifier 130 to receive the read-data signal R_DATA from the bit line 170. The column decoder 140 may provide the read-and-write enable signal RW_EN to the switching element 310 to turn on the switching element 310. When the switching element 310 is turned on, a voltage of the bit line 170 in a programmed OTP memory cell 111 may be discharged to the ground voltage (VSS). Meanwhile, a voltage of the bit line 170 in an unprogrammed OTP memory cell 111 may remain at the high level (or 1) because blowing of the OTP cell 320 does not occur even though the switching element 310 is turned on by the read-and-write enable signal RW_EN. The programming and read operations of the OTP memory device 100 may be summarized as shown in Table 1.

TABLE 1

| Mode | Programming Operation | | Read Operation | |
| --- | --- | --- | --- | --- |
| OTPV_IN | OTPV_IN | OTPV_IN | VCI | VCI |
| RW_EN | OTPV_IN | OTPV_IN | VCI | VCI |
| Bit Line | OTPV_IN | 0 | 0 | 1 |
| DIN | 1 | 0 | X | X |
| DOUT | X | X | 1 | 0 |
| CELL | Programmed | Unprogrammed | Programmed | Unprogrammed |

As shown in Table 1, when a programming operation is performed on the OTP memory cells 111, the write switch 181 may be turned on and then the supply voltage OTPV_IN may be applied to the bit line 170. Then, data DIN 1 or 0 (shown in FIG. 2) may be programmed into an OTP memory cell 111 that is selected by the read-and-write enable signal RW_EN from the row of the OTP memory cells 111, to which the supply voltage OTPV_IN is applied via the bit line 170. Meanwhile, when a read operation is performed on the OTP memory cells 111, a rated voltage VCI may be provided to the data input circuit 120 and the column decoder 140. When a voltage of the bit line 170 of a programmed OTP memory cell 111 is detected as 0V, an output DOUT of the detection amplifier 130 may be at the high level (or 1). An OTP memory cell 111 selected in the above manner may correspond to a programmed cell 111.

Figure 5:
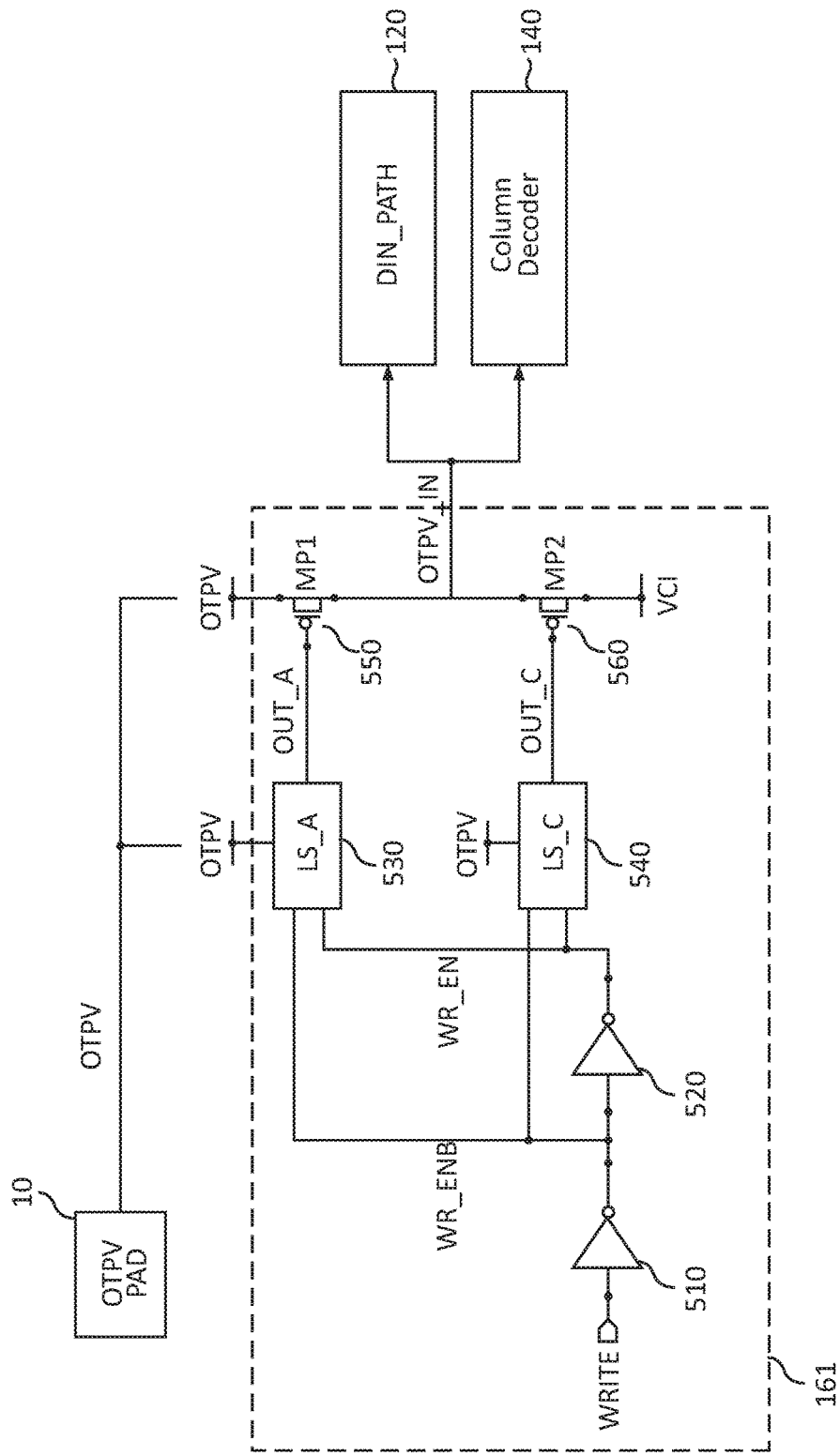
FIG. 5 schematically illustrates an example of a power selection circuit of the OTP memory device shown in FIG. 1, constructed according to the principles of the disclosure.

FIG. 5 is schematically illustrates an example of the power selection circuit 161 of the OTP memory device shown in FIG. 1, which is constructed according to the principles of the disclosure.

Referring to FIG. 5, the power selection circuit 161 may receive the external voltage OTPV from an external supply voltage pad 10, and the supply voltage OTPV_IN and the rated voltage VCI may be provided to the data input circuit 120 and the column decoder 140 in accordance with the write enable signal WR_EN. More specifically, the power selection circuit 161 may include first and second NOT gates (or inverters) 510 and 520, first and second level shifters 530 and 540, and first and second switching devices 550 and 560. The power selection circuit 161 may select the supply voltage OTPV_IN or the rated voltage VCI using the first and second switching devices 550 and 560, opening and closing of which are controlled based on the write enable signal WR_EN and a write enable bar signal WR_ENB, and may provide the selected voltage to the data input circuit 120 and the column decoder 140. The power selection circuit 161 may shift the write enable signal WR_EN and the write enable bar signal WR_ENB and turn on one of the first and second switching devices 550 and 560 so as to select the supply voltage OTPV_IN or the rated voltage VCI.

The first and second NOT gates 510 and 520 may be connected in series such that an output of the first NOT gate 510 may be applied as an input of the second NOT gate 520. Hence, respective outputs of the first and second NOT gates 510 and 520 may be always different. The power selection circuit 161 may receive a write signal WRITE, and the first and second NOT gates 510 and 520 may generate a write enable signal WR_EN and a write enable bar signal WR_ENB using the first and second NOT gates 510 and 520. Each of the first and second level shifters 530 and 540 may receive the write enable signal WR_EN and the write enable bar signal WR_ENB, respectively, shift levels of the received signals to the supply voltage OPTV_IN, and provide the supply voltage OTPV_IN to the first and second switching devices 550 and 560.

When a programming operation is performed on the OTP memory cells 111, the power selection circuit 161 may receive the write signal WRITE. When the power selection circuit 161 receives the write signal WRITE, the write enable bar signal WR_ENB may correspond to a low level (or 0) and the write enable signal WR_EN may correspond to a high level (or 1). If the write enable bar signal WR_ENB corresponds to the low level (or 0) and the write enable signal WR_EN corresponds to the high level (or 1), the first level shifter 530 may output a low level (or 0) to turn on the first switching device 550 (MP1), and the second level shifter 540 may output a high level (or 1) to turn off the second switching device 560 (MP2). That is, when a programming operation of the OTP memory cells 111 is performed, the power selection circuit 161 may turn on the first switching device 550 to provide the supply voltage OTPV_IN to the data input circuit 120 and the column decoder 140.

In one embodiment, when a read operation is performed on the OTP memory cells 111, the power selection circuit 161 may receive a low level (or 0). When the power selection circuit 161 receives the low level (or 0), the write enable bar signal WR_ENB may correspond to a high level (or 1) and the write enable signal WR_EN may correspond to a low level (or 0). In response to the write enable bar signal WR_ENB corresponding to the high level (or 1) and the write enable signal WR_EN corresponding to the low level (or 0), the first level shifter 530 may output a high level (or 1) to turn off the first switching device 550 and the second level shifter 540 may output a low level (or 0) to turn on the second switching device 560. Hence, when a read operation is performed, the power selection circuit 161 may turn on the second switching device 560 to provide the rated voltage VCI to the data input circuit 120 and the column decoder 140.

Figure 6:
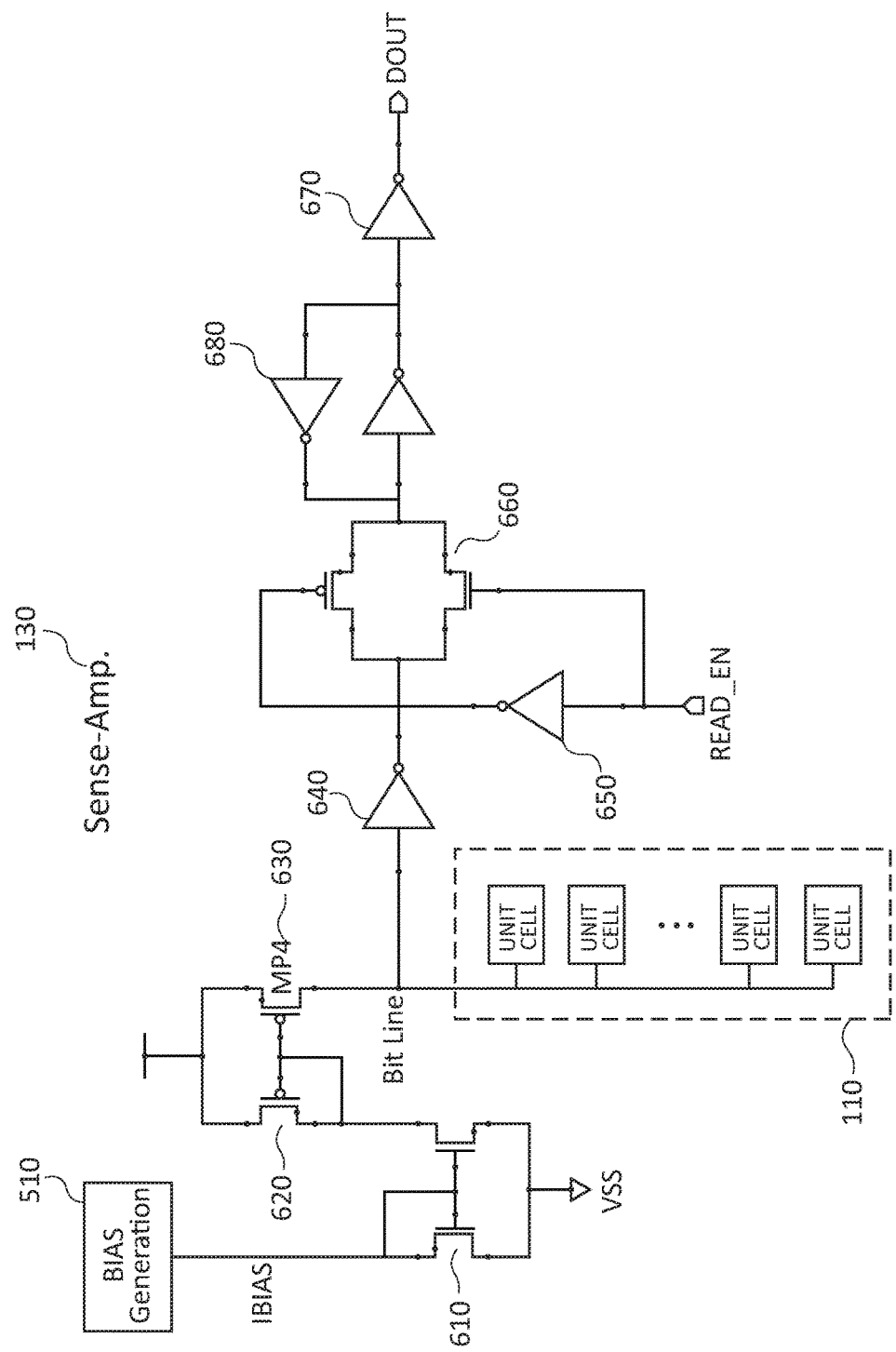
FIG. 6 schematically illustrates an example of a detection amplifier of the OTP memory device shown in FIG. 1, constructed according to the principles of the disclosure.

FIG. 6 schematically illustrates an example of the detection amplifier 130 of the OTP memory device 100 shown in FIG. 1, constructed according to the principles of the disclosure.

Referring to FIG. 6, the detection amplifier 130 may include a current mirror 610, third and fourth switching devices 620 and 630, third and fourth NOT gates 640 and 650, a transmission gate 660, a latch 680, and a fifth NOT gate 670.

The detection amplifier 130 may receive the bias current IBIAS from the bias generation circuit 150, and mirror the bias current IBIAS using the current mirror 610. The current mirrored by the current mirror 610 may be mirrored again by the third and fourth switching devices 620 and 630. The detection amplifier 130 may control currents flowing in the fourth switching device 630 using the current mirror 610 and the third and fourth switching devices 620 and 630.

Referring to FIG. 3, when a read operation is performed, each switching element 310 of the already programmed OTP memory cells 111 may receive the read-and-write enable signal RW_EN to be turned on. When each switching element 310 of the OTP memory cells 111 is turned on, the OTP cell 320 may receive a voltage of the bit line 170. The gate oxide of the programmed OTP cell 302 is blown. Thus, if the OTP cell 320 receives a read voltage (a rated voltage VCI) via the bit line 170, the gate and the P-well of the OTP cell 320 may be connected and therefore the voltage of the bit line 170 may be discharged to the ground voltage VSS. When the voltage of the bit line 170 is discharged to the ground voltage VSS, the detection amplifier 130 may receive the read enable signal READ_EN and then an output DOUT of the detection amplifier 130 may be latched into a high level (or 1) by, for example, the latch 680 (shown in FIG. 6).

Figure 7:
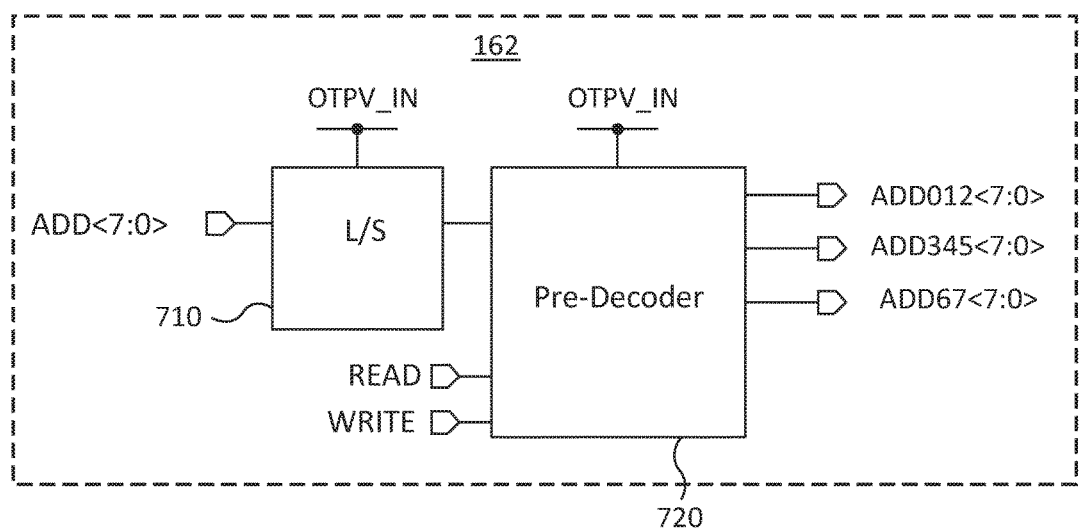
FIG. 7 schematically illustrates an example of an address decoder of the OTP memory device shown in FIG. 1, constructed according to the principles of the disclosure.
Figure 8:
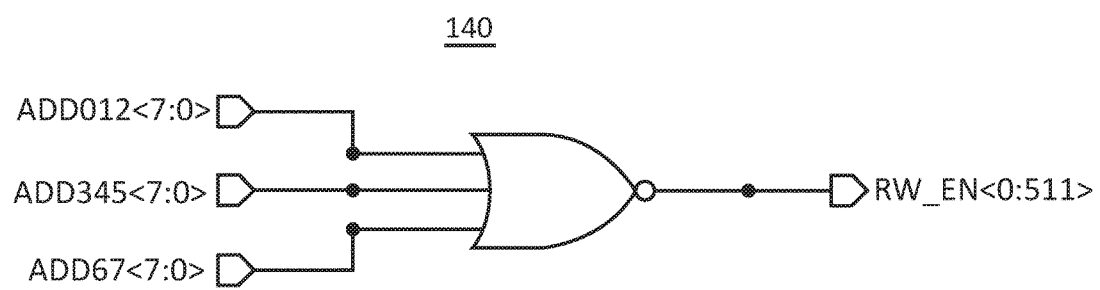
FIG. 8 schematically illustrates an example of a column decoder of the OTP memory device shown in FIG. 1, constructed according to the principles of the disclosure.

FIG. 7 schematically illustrates an example of the address decoder 162 of the OTP memory device 100 shown in FIG. 1, constructed according to the principles of the disclosure. FIG. 8 schematically illustrates an example of the column decoder 140 of the OTP memory device 100 shown in FIG. 1, constructed according to the principles of the disclosure.

Referring to FIG. 7, the address decoder 162 may include a third level shifter 710 and a pre-decoder 720. The address decoder 162 may shift a level of a power voltage VDD to be converted into the supply voltage OTPV_IN using the third level shifter 710, and pre-decode the level-shifted supply voltage OTPV_IN using the pre-decoder 720. For example, the address decoder 162 may receive the power voltage VDD (ADD<7:0>), and output the supply voltage OPTV_IN (ADD012<7:0>, ADD345<7:0>, ADD67<3:0>).

Referring to FIG. 8, the column decoder 140 may generate the read-and-write enable signal RW_EN based on the pre-decoded supply voltage ADD012<7:0>, ADD345<7:0>, ADD67<3:0>, and provide the read-and-write enable signal RW_EN to the OTP memory cells 111. For example, the column decoder 140 may provide the read-and-write enable signal RW_EN to the gate of the switching element 310 (shown in FIG. 3).

FIG. 9 schematically illustrates an example of a switch control circuit 183, which is constructed according to the principles of the disclosure. The switch control circuit 183 may be included in the command logic circuit 163 of the OTP memory device 100 shown in FIG. 1.

Referring to FIG. 9, the switch control circuit 183 may control the write switch 181 and the read switch 182 (shown in FIG. 2). More specifically, the switch control circuit 183 may generate a write switch enable signal WR_SW_EN for turning on/off the write switch 181, and a read switch enable signal RD_SW_EN for turning on/off the read switch 182. The switch control circuit 183 may generate the write switch enable signal WR_SW_EN by receiving the write signal WRITE (shown in FIG. 5) and an address signal Address, and may generate the read switch enable signal RD_SW_EN by receiving a read signal READ and the address signal Address.

When a programming operation is performed, the switch control circuit 183 may select one of the bit lines 170 by generating a write switch enable signal WR_SW_EN. For example, the switch control circuit 183 may turn on the write switch 181 connected to the selected bit line 170, and the data input circuit 120 may provide the write-data signal W_DATA to the selected bit line 170 to initiate a programming operation.

When a read operation is performed, the switch control circuit 183 may select one of the bit line 170 by generating a read switch enable signal RD_SW_EN. For example, the switch control circuit 183 may turn on the read switch 182 connected to the selected bit line 170, and the detection amplifier 130 may receive the read-data signal W_DATA from the selected bit line 170 to initiate a read operation.

The switch control circuit 183 may selectively generate one of the write switch enable signal WR_SW_EN and the read switch enable signal RD_SW_EN. For example, when a programming operation is performed, the switch control circuit 183 may generate the write switch enable signal WR_SW_EN. More specifically, when a programming operation is performed, the write switch 181 may be turned on and the read switch 182 may be turned off. When a read operation is performed, the switch control circuit 183 may generate the read switch enable signal RD_SW_EN. For example, when a read operation is performed, the write switch 181 may be turned off and the read switch 182 may be turned on. Thus, the switch control circuit 183 may selectively turn on one of the write switch 181 and the read switch 182 to perform a programming or read operation of the OTP memory cells 111.

Figure 10:
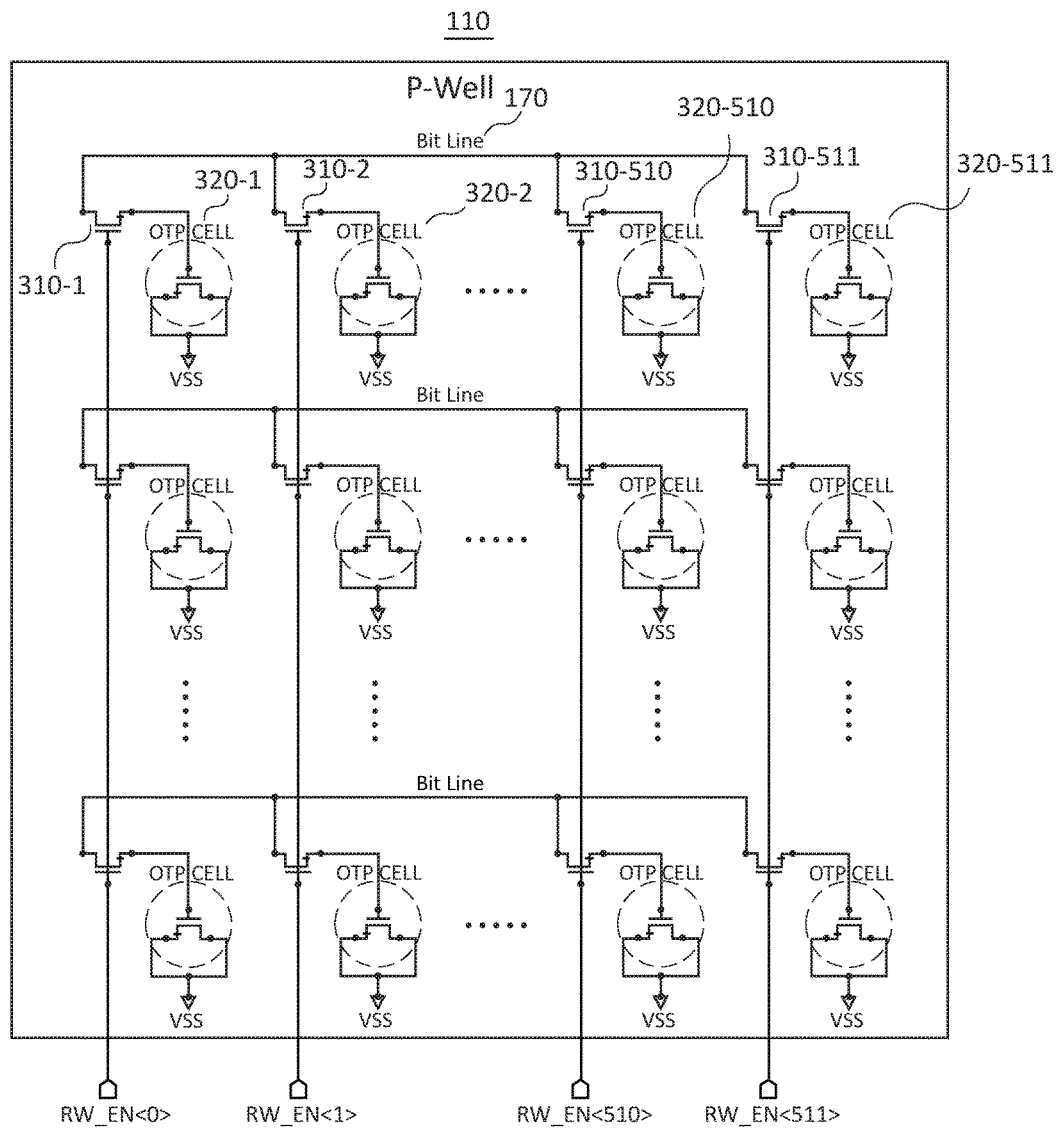
FIG. 10 schematically illustrates an example of a plurality of OTP memory cells of the OTP memory device shown in FIG. 1, constructed according to the principles of the disclosure.

FIG. 10 schematically illustrates a layout example of the OTP memory cells 111 of the OTP memory device shown in FIG. 1, constructed according to the principles of the disclosure.

Referring to FIG. 10, the OTP memory cells 111 may be laid out on a single P-well. Each of the OTP memory cells 111 may include the switching element 310 (e.g., switching element 310-1 to switching element 310-511, etc.) and the OTP cell 320 (e.g., OTP CELL 320-1 to OTP CELL 320-511, etc.). The OTP memory cell array 110 may not include an N-well, which may reduce a layout size. The power selection circuit 161 may provide the supply voltage OTPV_IN to the OTP cells 111 that may be routed in the OTP memory cell array 110. The OTP memory device 100 may turn on each switching element 310 to perform a programming operation, so that the supply voltage OPTV_IN is connected directly to the OTP cell 320. The OTP memory device 100 may apply the supply voltage OPTV_IN received from an external supply voltage pad 10, directly to the OTP cell 320, so that dropping of the supply voltage OTPV_IN may be prevented during a programming operation and the target supply voltage OTPV_IN may be applied to the OTP cell 320 in a precise manner.

Therefore, the OTP memory device 100 may receive the supply voltage OTPV_IN externally. The OTP memory cells 111 may be driven by the bit lines 170, without needing or using a source line, and arranged in a matrix of a plurality of rows and columns. The OTP memory device 100 may perform a programming operation without using or needing an additional voltage other than the supply voltage OTPV_IN. In response to simultaneous selection by the write switch 181 and the column decoder 140, the OTP memory cells 111 may perform a programming operation using the supply voltage applied to the bit line 170. In addition, the OTP memory cell arrays 110 may be driven using a single column decoder 140 and a single bias generation circuit 150, and the OTP memory cells 111 may be driven using a single data input circuit 120 and a single detection amplifier 130. Furthermore, the OTP memory cells 111 may be laid out on a single P-well.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

What is claimed is:

1. A one-time programmable (OTP) memory device comprising:
   a data input circuit that receives a supply voltage and applies the supply voltage to one of a plurality of bit lines that is selected by a write switch;
   an OTP memory cell array comprising a plurality of OTP memory cells arranged in a plurality of rows and columns, the OTP memory cells on the same row connected to the same bit line, wherein the plurality of OTP memory cells are formed without a source line;
   a column decoder that selects one of the plurality of columns of the OTP memory cells to apply the supply voltage thereto; and
   a detection amplifier that performs a read operation of the OTP memory cells connected to one of the plurality of bit lines that is selected by a read switch.

2. The OTP memory device of claim 1, wherein the OTP memory cells selected simultaneously by the write switch and the column decoder perform a programming operation.

3. The OTP memory device of claim 2, wherein the OTP memory cells selected simultaneously by the write switch and the column decoder receive the supply voltage from each of the data input circuit and the column decoder.

4. The OTP memory device of claim 1,
   wherein the OTP memory cells selected simultaneously by the write switch and the column decoder perform a programming operation using the supply voltage applied to the bit line.

5. The OTP memory device of claim 1, wherein each of the plurality of OTP memory cells comprises:
   a switching element that is connected to the bit line and is turned on or off in response to a selection by the column decoder; and an OTP cell that performs, when the switching element is turned on, a programming or read operation using a voltage applied to the bit line.

6. The OTP memory device of claim 5, wherein each of the OTP memory cells selected simultaneously by the write switch and the column decoder turns on the switching element to apply the supply voltage, which is received via a drain of the switching element, directly to the OTP cell.

7. The OTP memory device of claim 5, wherein each of the OTP memory cells selected simultaneously by the read switch and the column decoder turns on the switching element to perform a read operation.

8. The OTP memory device of claim 1, wherein the plurality of OTP memory cells are formed on a single P-well.

9. The OTP memory device of claim 1, further comprising a power selection circuit that receives the supply voltage from an external supply voltage pad and provides the supply voltage to the data input circuit and the column decoder.

10. The OTP memory device of claim 9,
wherein the power selection circuit selects the supply voltage or a rated voltage using first and second switching devices and provides the selected voltage to the data input circuit and the column decoder, and
wherein the first and second switching devices are opened and closed based on a write enable signal and a write enable bar signal.

11. The OTP memory device of claim 10, wherein the power selection circuit shifts the write enable signal and the write enable bar signal and turns on one of the first and second switching devices to select the supply voltage or the rated voltage.

12. The OTP memory device of claim 9, wherein the OTP memory cells selected simultaneously by the write switch and the column decoder perform a programming operation using the supply voltage provided from the power selection circuit.

13. The OTP memory device of claim 1, further comprising an address decoder that shifts a level of a power voltage prior to converting the power voltage to the supply voltage, and pre-decodes the level-shifted supply voltage.

14. The OTP memory device of claim 13, wherein the column decoder generates a read-and-write enable signal based on the pre-decoded supply voltage, and provides the read-and-write enable signal to the plurality of OTP memory cells.

15. The OTP memory device of claim 1, further comprising a switch control circuit that generates a write switch enable signal that turns on the write switch, and a read switch enable signal that turns on the read switch.

16. The OTP memory device of claim 1, further comprising a plurality of input/output (TO) modules, wherein each TO module comprises the OTP memory cell array, the data input circuit, and the detection amplifier.

17. The OTP memory device of claim 16, wherein the plurality of OTP memory cells included in each TO module are controlled by the same column decoder.

18. A one-time programmable (OTP) memory device, comprising:
a data input circuit that receives a supply voltage and applies the supply voltage to one of a plurality of bit line that is selected by a write switch;
an OTP memory cell array comprising a plurality of OTP memory cells arranged in a plurality of rows and columns, the OTP memory cells arranged on the same row connected to the same bit line, wherein the plurality of OTP memory cells are formed without a source line;
a column decoder that selects one of the plurality of columns of the OTP memory cells to apply the supply voltage thereto;
a power selection circuit that receives the supply voltage from a supply voltage pad and provides the supply voltage to the data input circuit and the column decoder; and
an address decoder that shifts a level of a power voltage to generate the supply voltage, and pre-decodes the level-shifted supply voltage.

19. A one-time programmable (OTP) memory device, comprising:
a plurality of OTP memory cells arranged in a plurality of rows and columns, wherein the plurality of OTP memory cells are formed without a source line;
a plurality of bit lines, each bit line connected to the OTP memory cells on the same row;
a data input circuit that applies a supply voltage to one of the plurality of bit lines; and
a column decoder that applies the supply voltage to one of the plurality of columns of the OTP memory cells, wherein a programming operation is performed on the OTP memory cell that is on the column applied with the supply voltage and connected to the bit line applied with the supply voltage.

20. The OTP memory device of claim 19, further comprising a write switch that selects one of the plurality of bit lines for the programming operation.

* * * * *